(12) United States Patent
Bartlett et al.

(10) Patent No.: US 6,350,188 B1
(45) Date of Patent: Feb. 26, 2002

(54) DRIVE SYSTEM FOR A CARRIER HEAD SUPPORT STRUCTURE

(75) Inventors: William Bartlett, Los Gatos; Arulkumar Shanmugasundram, Mountain View; Jim Tobin, Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/523,402

(22) Filed: Mar. 10, 2000

(51) Int. Cl.[7] .................................................. B24B 5/02
(52) U.S. Cl. ........................ 451/288; 451/285; 451/342
(58) Field of Search .................. 451/41, 259, 285–288, 451/342

(56) References Cited

U.S. PATENT DOCUMENTS

| 5,333,413 A | * | 8/1994 | Hashimoto | 451/287 X |
| 5,647,792 A | * | 7/1997 | Katsuoka et al. | 451/287 X |
| 5,681,215 A | * | 10/1997 | Sherwood et al. | 451/288 X |
| 5,738,574 A | * | 4/1998 | Tolles et al. | 451/287 X |
| 6,143,127 A | * | 11/2000 | Perlov et al. | 451/285 X |
| 6,184,139 B1 | * | 2/2001 | Adams et al. | 451/287 X |

* cited by examiner

Primary Examiner—Joseph J. Hail, III
Assistant Examiner—Anthony Ojini
(74) Attorney, Agent, or Firm—Fish & Richardson

(57) ABSTRACT

A chemical mechanical polishing apparatus has a polishing station, a transfer station, a carrier head to support a substrate, a rotatable carousel supporting the carrier head, a carousel drive shaft coupled to the carousel to rotate the carousel, and a carousel drive system. The carousel is rotatable between a first position in which the carrier head is in the polishing station and a second position in which the carrier head is in the transfer station. The carousel drive system includes a drive motor, a gear reduction box coupled to an output of the drive motor, and a brake system coupling the gear reduction box to the drive shaft.

19 Claims, 4 Drawing Sheets

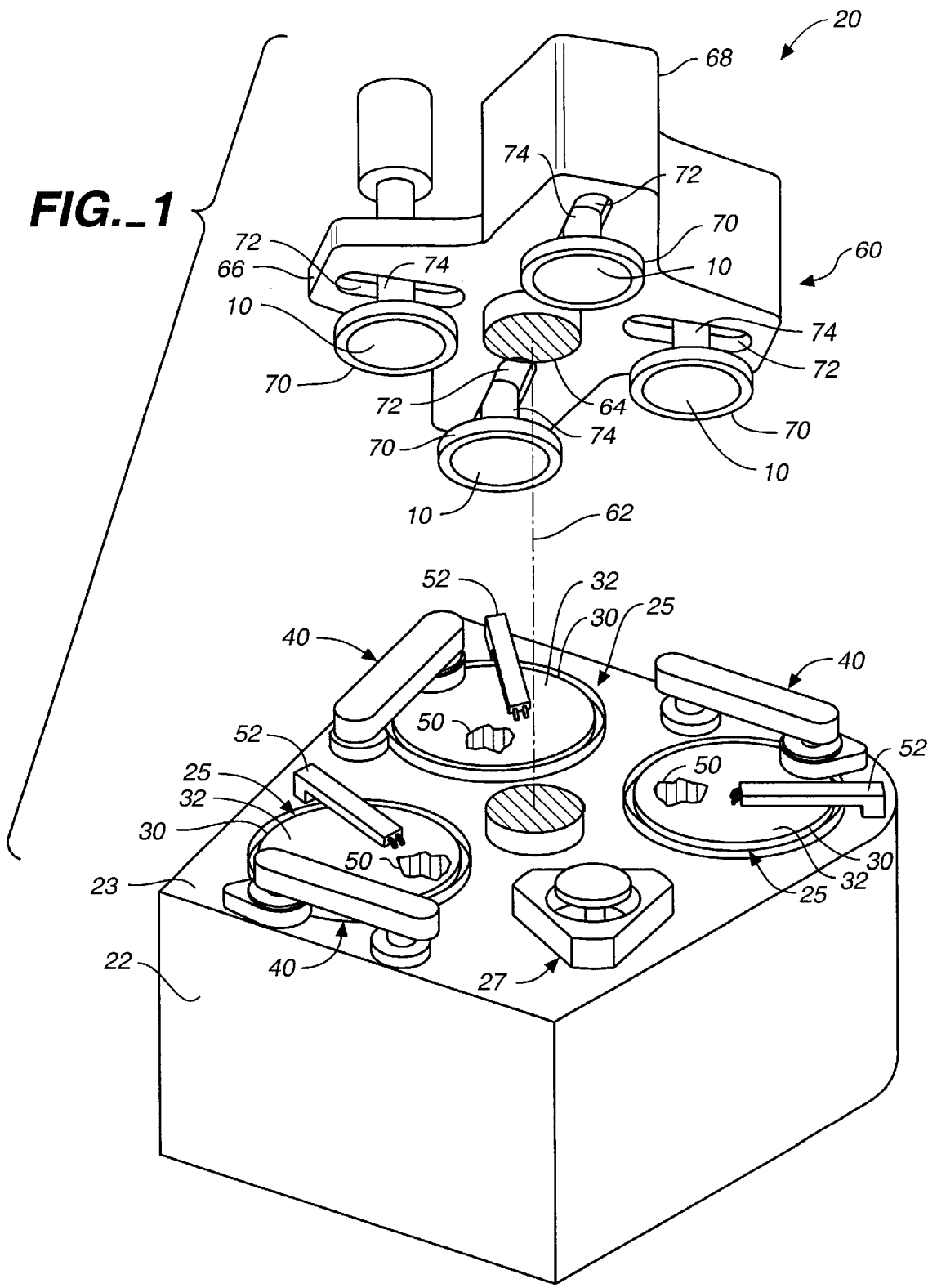
FIG._1

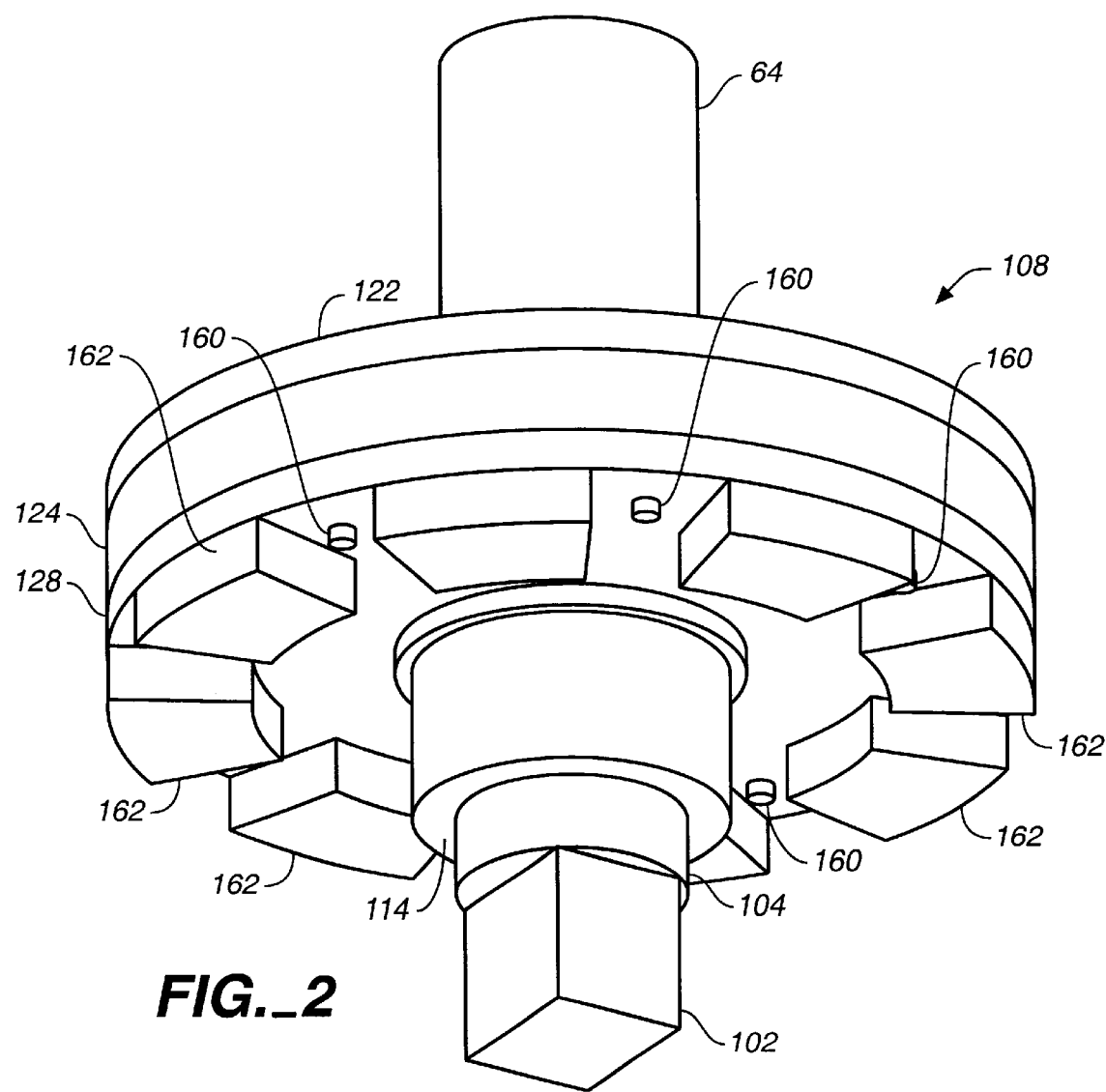
FIG._2

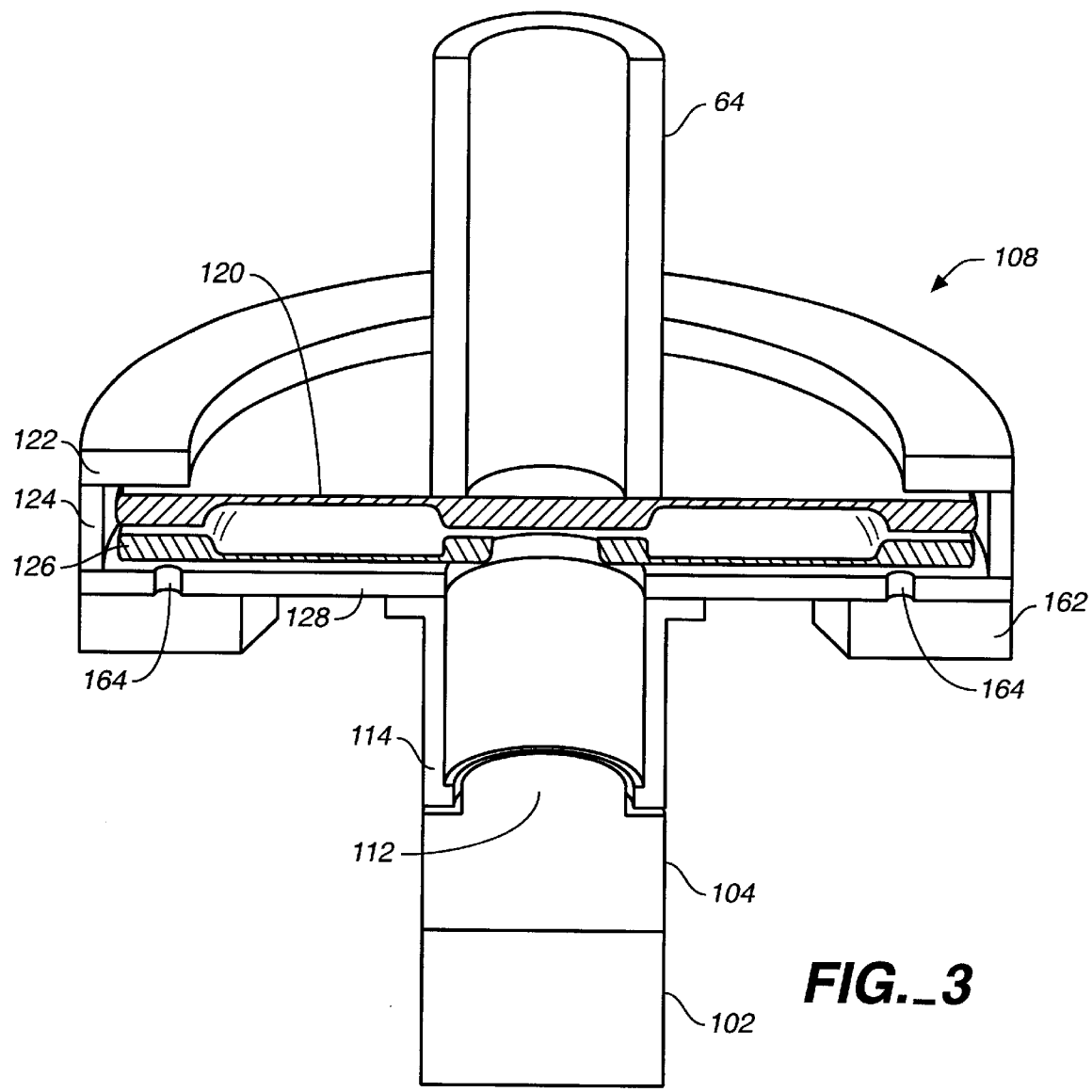
FIG._3

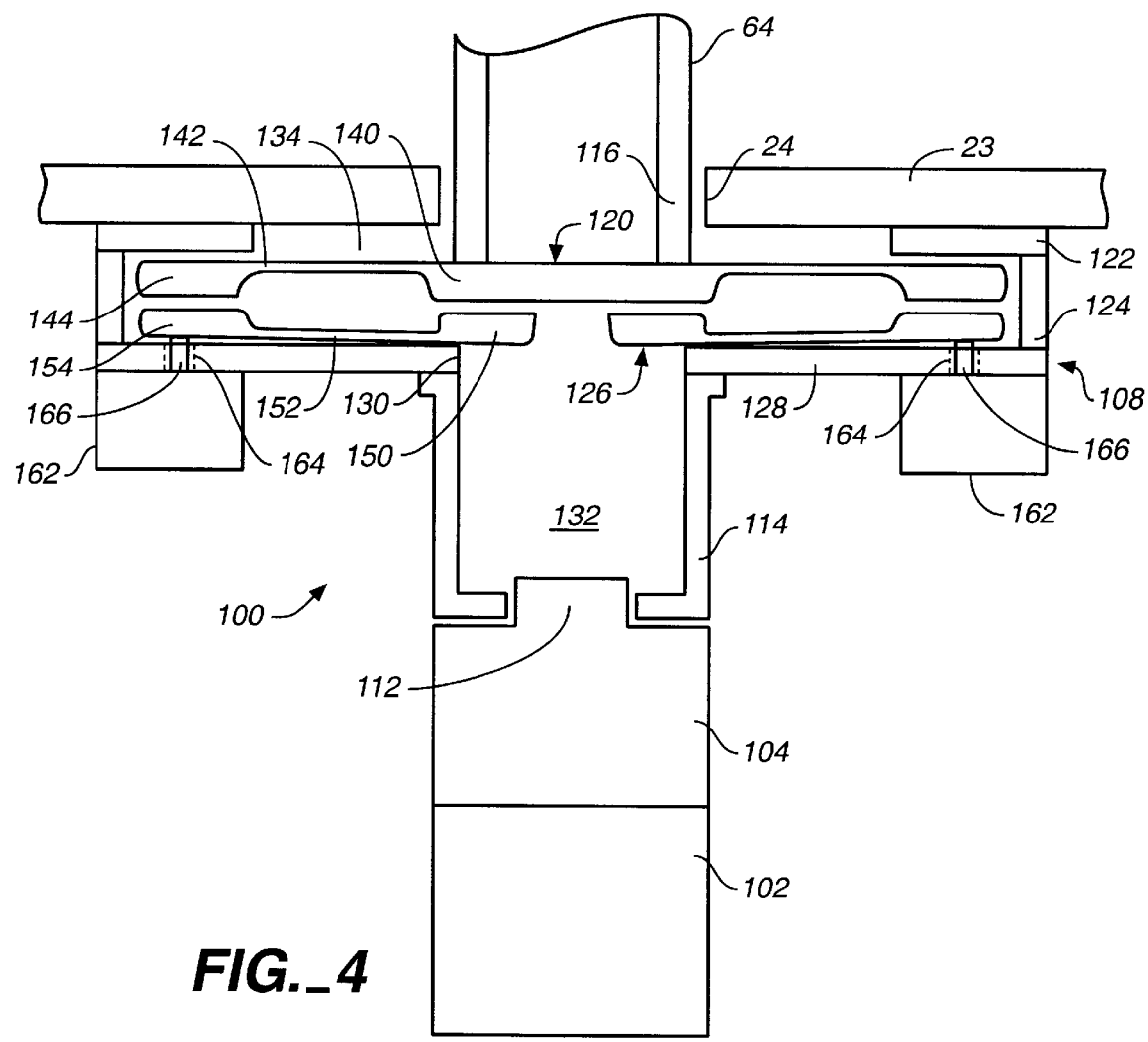
FIG._4

DRIVE SYSTEM FOR A CARRIER HEAD SUPPORT STRUCTURE

BACKGROUND

The present invention relates generally to a drive system of an apparatus for transporting substrates through a chemical mechanical polishing system.

Integrated circuits are typically formed on substrates, particularly silicon wafers, by the sequential deposition of conductive, semiconductive or insulative layers. After each layer is deposited, it is etched to create circuitry features. As a series of layers are sequentially deposited and etched, the outer or uppermost surface of the substrate, i.e., the exposed surface of the substrate, becomes increasingly non-planar. This non-planar surface presents problems in the photolithographic steps of the integrated circuit fabrication process. Therefore, there is a need to periodically planarize the substrate surface.

Chemical mechanical polishing (CMP) is one accepted method of planarization. This planarization method typically requires that the substrate be mounted on a carrier or polishing head. The exposed surface of the substrate is placed against a rotating polishing pad. The polishing pad may be either a "standard" or a fixed-abrasive pad. A standard polishing pad has durable roughened surface, whereas a fixed-abrasive pad has abrasive particles held in a containment media. The carrier head provides a controllable load, i.e., pressure, on the substrate to push it against the polishing pad. A polishing slurry, including at least one chemically-reactive agent, and abrasive particles, if a standard pad is used, is supplied to the surface of the polishing pad.

The carrier heads that hold the substrates are conventionally mounted on a movable carrier support structure. For example, the Mirra™ chemical mechanical polisher, available from Applied Materials, Inc., includes a carousel that supports four carrier heads. Typically, the carrier support structure can transport each carrier head and the substrate attached thereto between a first position, where the substrate is loaded or unloaded from the carrier head, and a second position, where the substrate is polished.

One problem that has been discovered is that the forces generated on the carrier head during polishing by a moving polishing pad can cause the entire support structure to move or vibrate. These vibrations can disrupt the polishing process, thereby creating non-uniform polishing rates across the substrate and introducing defects.

SUMMARY

In one aspect, the invention is directed to a chemical mechanical polishing apparatus. The apparatus has a polishing station, a transfer station, a carrier head to support a substrate, a rotatable carousel supporting the carrier head, a carousel drive shaft coupled to the carousel to rotate the carousel, and a carousel drive system. The carousel is rotatable between a first position in which the carrier head is in the polishing station and a second position in which the carrier head is in the transfer station. The carousel drive system includes a drive motor, a gear reduction box coupled to an output of the drive motor, and a brake system coupling the gear reduction box to the drive shaft.

Implementations of the invention may include one or more of the following features. The brake system may include a rotor coupled to a lower end of the drive shaft. A central portion of the rotor may be coupled to the drive shaft, and frictional force may be applied to a perimeter portion of the rotor when braking the drive shaft. The perimeter portion of the rotor is gripped between a first ring and second ring during braking. An actuator may press the first ring against the perimeter portion of the rotor. An annular middle portion of the rotor may connect the perimeter portion to the central portion. The annular middle portion of the rotor may be sufficiently thin so as to flex to permit the perimeter portion to undergo vertical motion. A support plate may be secured in a parallel and spaced-apart arrangement with the second ring, with the perimeter portion of the rotor positioned between the support plate and the first ring. A clamp disk may be positioned between the rotor and the support plate. The clamp disk may have a central portion secured to a support plate and a perimeter portion that forms the second ring. The clamp disk may include an annular middle portion connecting the perimeter portion to the central portion, the annular middle portion being sufficiently thin so as to flex to permit the perimeter portion of the clamp disk to undergo vertical motion. A plurality of springs may urge the second ring toward the perimeter portion of the rotor.

In another aspect, the invention is directed to a drive system for a carrier head support structure in a chemical mechanical polishing apparatus. The drive system has a drive shaft to be coupled to carrier head support structure, a drive motor, a gear reduction box coupled to an output of the drive motor, and a brake system coupling the gear reduction box to the drive shaft.

Potential advantages of implementations of the invention may include zero or more of the following. Less backlash, play and flexibility in a gear reduction box is transmitted to a drive shaft of a carrier head support structure. Thus, vibration and motion of a carrier head support structure, such as a multi-head carousel, can be reduced during polishing. This can improve polishing uniformity, decrease defects, and increase yield.

Other advantages and features of the invention will be apparent from the following description, including the drawings and claims.

BRIEF DESCRIPTION OF THE DRAWINGS

FIG. 1 is an exploded perspective view of a chemical mechanical polishing apparatus.

FIG. 2 is a schematic perspective view of a carousel drive system.

FIG. 3 is a schematic perspective view, partially cross-sectional, of the carousel drive system of FIG. 2.

FIG. 4 is a schematic cross-sectional view of the carousel drive system of FIG. 2.

DETAILED DESCRIPTION

Referring to FIG. 1, one or more substrates 10 will be polished by a chemical mechanical polishing (CMP) apparatus 20. A description of a similar CMP apparatus may be found in U.S. Pat. No. 5,738,574, the entire disclosure of which is hereby incorporated by reference.

The CMP apparatus 20 includes a lower machine base 22 with a table top 23 mounted thereon and a removable upper outer cover (not shown). The table top 23 supports a series of polishing stations 25 and a transfer station 27 for loading and unloading the substrates. The transfer station 27 may form a generally square arrangement with the three polishing stations 25.

Each polishing station 25 includes a rotatable platen 30 on which is placed a polishing pad 32. Each platen 30 may be connected to a platen drive motor (not shown) located inside the machine base 22. Each polishing station 25 may further include an associated pad conditioner apparatus 40 to maintain the abrasive condition of the polishing pad.

A slurry 50 containing a reactive agent (e.g., deionized water for oxide polishing) and a chemically-reactive catalyzer (e.g., potassium hydroxide for oxide polishing) may be supplied to the surface of the polishing pad 32 by a combined slurry/rinse arm 52. If the polishing pad 32 is a standard pad, the slurry 50 may also include abrasive particles (e.g., silicon dioxide for oxide polishing). Typically, sufficient slurry is provided to cover and wet the entire polishing pad 32. The slurry/rinse arm 52 includes several spray nozzles (not shown) which provide a high pressure rinse of the polishing pad 32 at the end of each polishing and conditioning cycle.

A rotatable multi-head carousel 60, including a carousel support plate 66 and a cover 68, is positioned above the lower machine base 22. The carousel support plate 66 is rotated by a center post or torque tube 64 about a carousel axis 62 by a carousel motor assembly 100 (see FIG. 2) located within the machine base 22. The multi-head carousel 60 includes four carrier heads 70 mounted at equal angular intervals about the carousel axis 62. The carousel motor assembly 100 rotates the carousel 60 to orbit the carrier head systems and transfer the substrates between the polishing stations and the transfer station.

Each carrier head 70 can independently rotate about its own axis, and independently laterally oscillates in a radial slot 72 formed in carousel support plate 66. A carrier drive shaft 74 extends through the slot 72 to connect a carrier head rotation motor 76 (shown by the removal of one-quarter of cover 68) to the carrier head 70. Each motor and drive shaft may be supported on a slider (not shown) which can be linearly driven along the slot by a radial drive motor to laterally oscillate the carrier head. A description of a suitable carrier head may be found in U.S. application Ser. No. 08/861,2600, filed May 21, 1997, the entire disclosure of which is hereby incorporated by reference.

During polishing, three of the carrier heads are positioned at and above the polishing stations. Each carrier head 70 lowers a substrate into contact with a polishing pad 32. The carrier head 70 applies a downward load to the back surface of the substrate as the platen 30 and the carrier head 70 rotate to generate relative motion between the substrate and the polishing pad.

The carousel motor assembly 100 is located below table top 23. The carousel motor assembly rotates torque tube 64, which projects upwardly through an aperture 24 in the table top (see FIG. 4) to rotate the carousel.

Referring to FIGS. 2–4, the drive train of carousel motor assembly 100 includes a drive motor 102, a gear reduction box 104, and an external cross brake 108. One implementation of the carousel motor assembly 100 is shown in FIGS. 1 and 2. In this implementation, the output from the drive motor 102 is fed into the gear reduction box 104. The gear reduction box 104 operates at a gear ratio of about 50:1 to 100:1, e.g., 80:1. A hollow gear box mount 114 fits over an output shaft 112 from the gear reduction box 104. Two stub shafts and a coupling (not shown) are located in a chamber 132 in the gear box mount 114 to connect the output shaft 112 to a rotor disk 120 in the cross brake 108. The center of the rotor disk 120 is secured to a lower end 116 of the torque tube 64. Thus, the output shaft 112 can transmit torque to the rotor disk 120 and thereby rotate the torque tube 64.

The cross brake 108 includes the rotor disk 120, as well as a mounting ring 122, a spacer ring 124, a clamp disk 126 and a rigid annular support plate 128. The annular mounting ring 122 is secured, e.g., by bolts or screws, to the underside of the table top 23 to hold the cross brake 108 in place. The mounting ring 122 can surround the aperture 24 in the table top 23 through which the torque tube 64 projects. Both the mounting ring 122 and the support plate 128 are secured to the spacer ring 124, which holds them in a parallel and spaced apart arrangement. The gear box mount 114 is secured to the underside of the support plate 128 with a central aperture 130 in the support plate aligned with the chamber 132 in the gear box mount. Thus, motor 102, gear reduction box 104 and gear reduction gear box mount 114 are suspended from the underside of the cross brake 108.

The rotor disk 120 and the clamp disk 126 of the cross brake 108 are positioned in a circular cavity 134 between the support plate 128 and the underside of the table top. The rotor disk 120 includes a thick central section 140 that is secured to the torque tube 64, an annular outer section 144 of about the same thickness as the central section 140 positioned between the mounting ring 122 and the clamp disk 126, and a thin flexible annular middle section 142 connecting the central section 140 to the outer section 144. Similarly, the clamp disk 126 includes a relatively thick central section 150 secured to the support plate 128, an annular outer section 154 of about the same thickness as the central section 150 positioned between the outer section 144 of the rotor disk 120 and the support plate 128, and a thin and flexible annular middle section 152 connecting the central section 150 to the outer section 154.

A plurality of springs are placed in corresponding recesses 160 in the upper surface of the support plate 128 (the springs are not visible, although the protrusion of the recesses 160 from the bottom surface of the support plate 128 can be seen in FIG. 2). The springs apply an upward pressure to the outer section 154 of the clamp disk 126.

In addition to the springs, a plurality, e.g., eight, of pneumatic actuators 162, e.g., air cylinders, are secured to the perimeter of the support plate 128. Each air cylinder 162 includes an actuator shaft 166 that extends through a corresponding aperture 164 in the support plate 128 and is connected, e.g., by screws or bolts, to the outer section 154 of the clamp disk 126.

The cross brake 108 is used to prevent rotation of the torque tube 64 and the carousel 60 when the carrier heads 70 are properly positioned over their respective polishing and transfer stations. Specifically, the outer section 144 of the rotor disk 120 is sandwiched between the outer section 154 of the clamp disk 126 and the mounting ring 122. The friction on the rotor disk 120 slows rotation of the torque tube 64.

In a "neutral" state, the springs bias the outer section 154 of the clamp disk 126 into contact with the the outer section 144 of the rotor 120. However, the air cylinders 126 can overcome the bias from the springs to move the clamp disk 126 out of contact with the rotor 120, or supplement the springs to increase the pressure of the clamp disk 126 out of contact with the rotor 120. To increase the braking power and further reduce or prevent rotation, the air cylinders 162 cause the actuator shafts 166 to push upwardly on the outer section 154 of the clamp disk 126, and clench the rotor disk 120 between the clamp disk 126 and the mounting ring 122 with greater force. To decrease the braking power and permit free rotation of the torque tube 64, the air cylinders 162 cause the actuator shafts 166 to pull downwardly on the outer section 154 of the clamp disk 126, thereby moving the clamp disk 126 out of contact with the rotor disk 120.

By making both the middle sections 142, 152 of the rotor disk 120 and clamp disk 126 flexible, the outer sections 144, 154 can deflect slightly along a vertical axis. This permits the outer sections 144, 154 to move into or out of contact, without requiring a spline or significant vertical clearance. When the carousel is rotating, the outer sections 144, 154 of the rotor disk 120 and clamp disk 126 can move apart to reduce drag on the torque tube 64. On the other hand, when the carousel has stopped rotating, the air cylinders 162 can move the outer sections 144, 154 of the rotor disk 120 and clamp disk 126 into contact and prevent rotation of the torque tube 64. Moreover, the cross brake 108 prevents backlash, play and flexibility in the gear reduction box 114 from being transmitted to the torque tube 64. This permits the carousel to position the carrier heads 70 more precisely over the polishing and transfer stations when the carousel comes to a stop.

The present invention has been described in terms of a number of embodiments. The invention, however, is not limited to the embodiments depicted and described. Rather, the scope of the invention is defined by the appended claims.

What is claimed is:

1. A chemical mechanical polishing apparatus, comprising:
    a polishing station;
    a transfer station;
    a carrier head to support a substrate;
    a rotatable carousel supporting the carrier head, the carousel rotatable between a first position in which the carrier head is in the polishing station and a second position in which the carrier head is in the transfer station;
    a carousel drive shaft coupled to the carousel to rotate the carousel; and
    a carousel drive system, including
        a drive motor,
        a gear reduction box coupled to an output of the drive motor, and
        a resistive damping brake system coupling the gear reduction box to the drive shaft.

2. The apparatus of claim 1, wherein the brake system includes a rotor coupled to a lower end of the drive shaft.

3. The apparatus of claim 2, wherein the rotor includes a central portion coupled to the drive shaft and a perimeter portion to which frictional forces are applied when braking the drive shaft.

4. The apparatus of claim 3, wherein during braking the perimeter portion of the rotor is gripped between a first ring and second ring.

5. The apparatus of claim 4, wherein the brake system includes an actuator to press the first ring against the perimeter portion of the rotor.

6. The apparatus of claim 5, wherein the brake system includes a plurality of springs to urge the second ring toward the perimeter portion of the rotor.

7. The apparatus of claim 4, wherein the rotor includes annular middle portion connecting the perimeter portion to the central portion, the annular middle portion being sufficiently thin so as to flex to permit the perimeter portion to undergo vertical motion.

8. The apparatus of claim 7, wherein the brake system includes a support plate secured in a parallel and spaced-apart arrangement with the second ring, with the perimeter portion of the rotor positioned between the support plate and the first ring.

9. The apparatus of claim 8, wherein the brake system includes a clamp disk positioned between the rotor and the support plate, the clamp disk including a central portion secured to a support plate and a perimeter portion that forms the second ring.

10. The apparatus of claim 9, wherein the clamp disk includes an annular middle portion connecting the perimeter portion to the central portion, the annular middle portion being sufficiently thin so as to flex to permit the perimeter portion of the clamp disk to undergo vertical motion.

11. A chemical mechanical polishing apparatus, comprising:
    a polishing station;
    a transfer station;
    a carrier head to support a substrate;
    a rotatable carousel supporting the carrier head, the carousel rotatable between a first position in which the carrier head is in the polishing station and a second position in which the carrier head is in the transfer station;
    a carousel drive shaft coupled to the carousel to rotate the carousel; and
    a carousel drive system, including
        a drive motor,
        a gear reduction box coupled to an output of the drive motor, and
        a brake system coupling the gear reduction box to the drive shaft;
    wherein the brake system includes a rotor coupled to a lower end of the drive shaft, and the rotor includes a central portion coupled to the drive shaft and a perimeter portion to which frictional forces are applied when braking the drive shaft.

12. The apparatus of claim 11, wherein during braking the perimeter portion of the rotor is gripped between a first ring and second ring.

13. The apparatus of claim 12, wherein the brake system includes an actuator to press the first ring against the perimeter portion of the rotor.

14. The apparatus of claim 13, wherein the brake system includes a plurality of springs to urge the second ring toward the perimeter portion of the rotor.

15. The apparatus of claim 12, wherein the rotor includes a annular middle portion connecting the perimeter portion to the central portion, the annular middle portion being sufficiently thins so as to flex to permit the perimeter portion to undergo vertical motion.

16. The apparatus of claim 15, wherein the brake system includes a support plate secured in a parallel and spaced-apart arrangement with the second ring, with the perimeter portion of the rotor positioned between the support plate and the first ring.

17. The apparatus of claim 16, wherein the brake system includes a clamp disk positioned between the rotor and the support plate, the clamp disk including a central portion secured to a support plate and a perimeter portion that forms the second ring.

18. The apparatus of claim 17, wherein the clamp disk includes an annular middle portion connecting the perimeter portion to the central portion, the annular middle portion being sufficiently thin so as to flex to permit the perimeter portion of the clamp disk to undergo vertical motion.

19. A drive system for a carrier head support structure in a chemical mechanical polishing apparatus, comprising:
    a drive shaft to be coupled to carrier head support structure;
    a drive motor;
    a gear reduction box coupled to an output of the drive motor; and
    a resistive damping brake system coupling the gear reduction box to the drive shaft.

* * * * *